United States Patent [19]

Yabuki et al.

[11] Patent Number: 4,649,103

[45] Date of Patent: Mar. 10, 1987

[54] HEAT-DEVELOPABLE LIGHT-SENSITIVE MATERIAL

[75] Inventors: Yoshiharu Yabuki; Kozo Sato; Ken Kawata; Hiroyuki Hirai, all of Kanagawa, Japan

[73] Assignee: Fuji Photo Film Co., Ltd., Kanagawa, Japan

[21] Appl. No.: 769,299

[22] Filed: Aug. 26, 1985

[30] Foreign Application Priority Data

Aug. 25, 1984 [JP] Japan ............................ 59-176999

[51] Int. Cl.⁴ .............................................. G03C 1/02
[52] U.S. Cl. .................................... 430/570; 430/617; 430/619; 430/620; 430/955; 430/203; 430/171; 430/151; 430/351; 430/352; 430/559; 430/562
[58] Field of Search ............... 430/617, 619, 620, 955, 430/957, 203, 151, 179, 570, 351, 352, 559, 562

[56] References Cited

U.S. PATENT DOCUMENTS

| | | | |
|---|---|---|---|
| 3,220,846 | 11/1965 | Tinker et al. | 430/151 |
| 4,487,826 | 12/1984 | Watanabe et al. | 430/151 |
| 4,514,493 | 4/1985 | Hirai et al. | 430/617 |

FOREIGN PATENT DOCUMENTS 909491 10/1962 United Kingdom ................ 430/151

*Primary Examiner*—Won H. Louie
*Attorney, Agent, or Firm*—Sughrue, Mion, Zinn, Macpeak and Seas

[57] ABSTRACT

A heat-developable light-sensitive material is disclosed, comprising a support and at least one layer containing a novel base precursor releasing a base by thermal decomposition. The heat-developable light-sensitive material of the invention has an improved long-term stability and can provide a high density image in a short time.

7 Claims, No Drawings

HEAT-DEVELOPABLE LIGHT-SENSITIVE MATERIAL

FIELD OF THE INVENTION

The present invention relates to a heat-developable light-sensitive material containing a base precursor.

BACKGROUND OF THE INVENTION

Heat-developable light-sensitive materials often contain a base or a base precursor in order to accelerate heat development. It is preferred to use a base precursor releasing a base by thermal decomposition for obtaining good storage stability of a light-sensitive material.

Typical examples of a base precursor are described in British Pat. No. 998,949. A preferred base precursor is a salt of a carboxylic acid and an organic base. Useful carboxylic acids are trichloroacetic acid and trifluoroacetic acid. Useful bases are guanidine, piperidine, morpholine, p-toluidine and 2-picoline. The guanidine trichloroacetate described in U.S. Pat. No. 3,220,846 is particularly useful. The aldoneamides described in Japanese Patent Application (OPI) No. 22625/75 are decomposed to generate bases at a high temperature and are used preferably. (The term "OPI" as used herein refers to a "published unexamined Japanese patent application".)

However, the light-sensitive materials containing these base precursors often require a relatively long time to produce an image or have high fog. Moreover, these base precursors are susceptible to being affected by air or moisture and are subsequently decomposed changing the photographic properties of the light-sensitive material or impairing its storage.

SUMMARY OF THE INVENTION

One object of the present invention is to provide a heat-developable light-sensitive material having an improved long-term stability. The term "long-term stability" used herein means that the changes in the photographic properties of a light-sensitive material, such as maximum density, minimum density and sensitivity, during storage before heat development are small.

Another object of the present invention is to provide a heat-developable light-sensitive material able to provide a high density image in a short time.

Still another object of the present invention is to provide a heat-developable light-sensitive material containing a new base precursor and providing a high-density and low-fog image.

These objects of the present invention are attained by a heat-developable light-sensitive material containing a base precursor represented by the following general formula [I]:

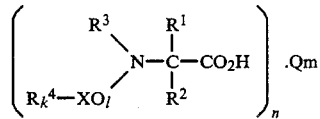

wherein X represents a carbon atom, a nitrogen atom or a sulfur atom, particularly preferably a nitrogen atom and a sulfur atom; $R^1$ and $R^2$ represent a hydrogen atom, a halogen atom (e.g., chlorine, bromine, and iodine), an alkyl group (preferably those having from 1 to 20 carbon atoms and more preferably those having from 1 to 8 carbon atoms, e.g., methyl and octyl), an alkenyl group (preferably those having from 1 to 20 carbon atoms and more preferably those having from 1 to 8 carbon atoms, e.g., vinyl and propenyl), an alkynyl group (preferably those having up to 20 carbon atoms and more preferably those having up to 8 carbon atoms, e.g., ethynyl), a cycloalkyl group (preferably those having up to 20 carbon atoms and more preferably those having up to 8 carbon atoms, e.g., cyclohexyl), an aralkyl group (preferably those having up to 20 carbon atoms and more preferably those having up to 8 carbon atoms, e.g., benzyl), an aryl group (preferably those having up to 20 carbon atoms and more preferably those having up to 8 carbon atoms, e.g., phenyl), an alkoxy group (preferably those having from 1 to 20 carbon atoms and more preferably those having from 1 to 8 carbon atoms, e.g., methoxy and ethoxy), an aryloxy group (preferably those having up to 20 carbon atoms and more preferably those having up to 8 carbon atoms, e.g., phenoxy), an alkylthio group (preferably those having from 1 to 20 carbon atoms and more preferably from 1 to 8 carbon atoms, e.g., methylthio and octylthio), an arylthio group (preferably those having up to 20 carbon atoms and more preferably those having up to 8 carbon atoms, e.g., phenylthio), a heterocyclic group (preferably a five-membered or six-membered heterocyclic group containing a nitrogen atom), an acylamino group (preferably those having up to 20 carbon atoms and more preferably those having up to 8 carbon atoms, e.g., acetylamido), an alkylsulfinyl group (preferably those having from 1 to 20 carbon atoms and more preferably from 1 to 8 carbon atoms, e.g., methylsulfinyl), an arylsulfinyl group (preferably those having up to 20 carbon atoms and more preferably those having up to 8 carbon atoms, e.g., phenylsulfinyl), a nitro group, an acyl group (preferably those having up to 20 carbon atoms and more preferably those having up to 8 carbon atoms, e.g., acetyl), a sulfamoyl group, a substituted sulfamoyl group (e.g., methylsulfamoyl and phenylsulfamoyl), a carbamoyl group, a substituted carbamoyl group (e.g., methylcarbamoyl and phenylcarbamoyl), an alkoxycarbonyl group (in which the alkyl moiety thereof has preferably from 1 to 20 carbon atoms and more preferably from 1 to 8 carbon atoms, e.g., methoxycarbonyl and butoxycarbonyl), an aryloxycarbonyl group (in which the aryl moiety thereof has preferably up to 20 carbon atoms and more preferably up to 8 carbon atoms, e.g., phenoxycarbonyl), a —CO$_2$H.Q group (Q represents a base described hereinafter), a

group, a

group (R represents an alkyl group (preferably those having from 1 to 20 carbon atoms and more preferably those having from 1 to 8 carbon atoms, e.g., methyl and octyl) or an aryl group (preferably those having up to 20 carbon atoms and more preferably those having up to 8 carbon atoms, e.g., phenyl)) or a hydroxy group; $R^3$ and $R_4$ represent a hydrogen atom, an alkyl group (preferably those having from 1 to 20 carbon atoms and more preferably those having from 1 to 8 carbon atoms, e.g., methyl and octyl), an alkenyl group (preferably those having from 1 to 20 carbon atoms and more preferably those having from 1 to 8 carbon atoms, e.g., vinyl and propenyl), an alkynyl group (preferably those having up to 20 carbon atoms and more preferably those having up to 8 carbon atoms, e.g., ethynyl), a cycloalkyl group (preferably those having up to 20 carbon atoms and more preferably those having up to 8 carbon atoms, e.g., cyclohexyl), an aralkyl group (preferably those having up to 20 carbon atoms and more preferably those having up to 8 carbon atoms, e.g., benzyl), an aryl group (preferably those having up to 20 carbon atoms and more preferably those having up to 8 carbon atoms, e.g., phenyl), an alkoxy group (preferably those having from 1 to 20 carbon atoms and more preferably those having from 1 to 8 carbon atoms, e.g., methoxy and ethoxy), an aryloxy group (preferably those having up to 20 carbon atoms and more preferably those having up to 8 carbon atoms, e.g., phenoxy), an alkylthio group (preferably those having from 1 to 20 carbon atoms and more preferably from 1 to 8 carbon atoms, e.g., methylthio and octylthio), an arylthio group (preferably those having up to 20 carbon atoms and more preferably those having up to 8 carbon atoms, e.g., phenylthio), a heterocyclic group (preferably a five- or six-membered heterocyclic group containing a nitrogen atom) or an acyl group (preferably those having up to 20 carbon atoms and more preferably those having up to 8 carbon atoms, e.g., acetyl). The alkyl group and the aryl group may have a substituent. At least two of $R^1$, $R^2$, $R^3$ and $R^4$ may combine with each other to make a ring; k represents 0 or 1; l represents an integer of 1 or 2; between k and l there is a numerical relation such that the valencies of X, $R^4$ and an oxygen atom balance each other; Q is a base (preferably a monovalent or divalent base having a pKa value of 7 or more and having from 1 to 12 carbon atoms); n and m represent an integer of 1 or 2 and between n and m there is a numerical relation such that the value of a plus valency and a minus valency are equal in the base precursor.

DETAILED DESCRIPTION OF THE INVENTION

In the above-mentioned formula representing the base precursor used in the present invention, Q preferably represents an organic base, preferably having a pKa value of 7 or more and a boiling point of 100° C. or higher, more preferably having a pKa value of 10 or more and being substantially non-volatile and not stinky. Examples of preferable base precursors are guanidine compounds, cycloguanidine compounds, amidine compounds and cycloamidine compounds. Moreover, the base represented by B is preferably hydrophilic and a base having up to 10 carbon atoms is used preferably.

Examples of preferable bases represented by Q are as follows:

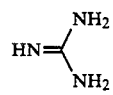
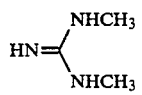
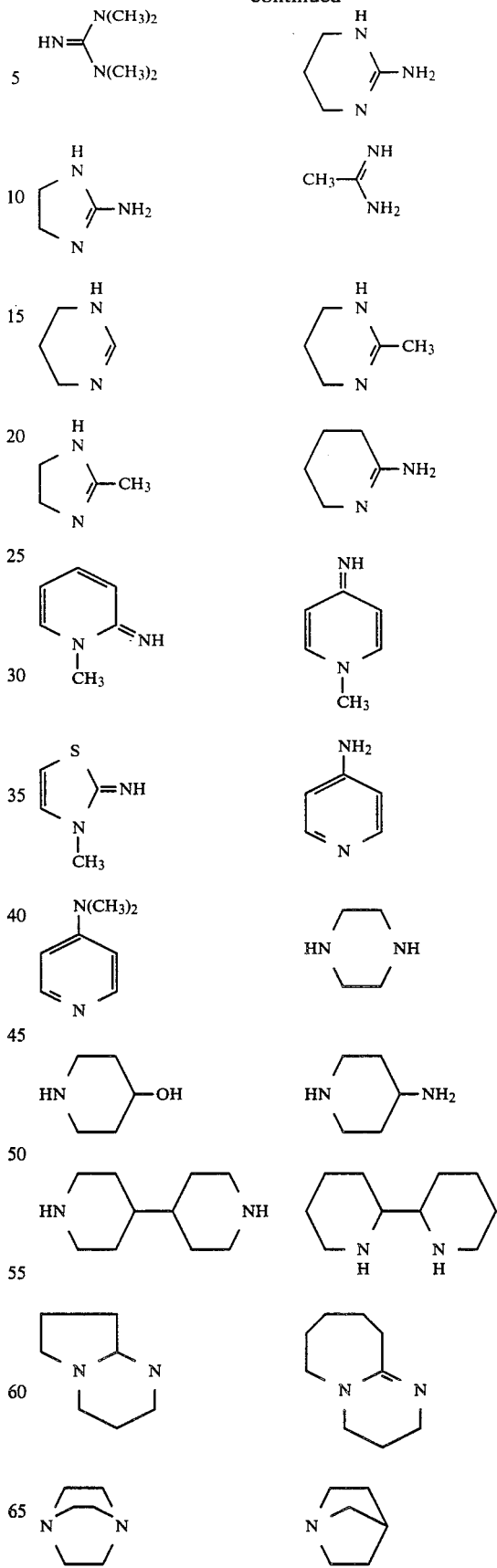

Specific examples of base precursors used in the present invention are described below, but the present invention is not limited to these examples.

(1) 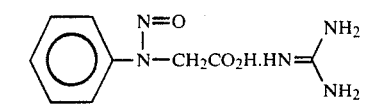

(2) 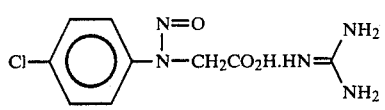

(3) 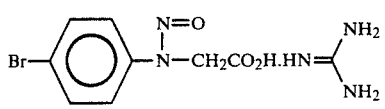

(4) 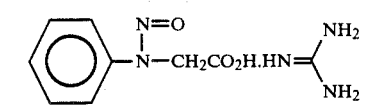

(5) 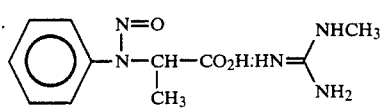

(6) 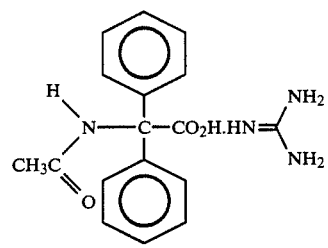

(7) 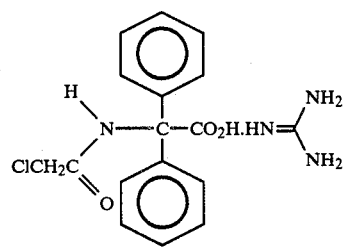

(8) 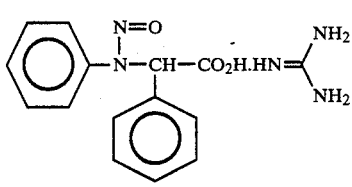

(9) 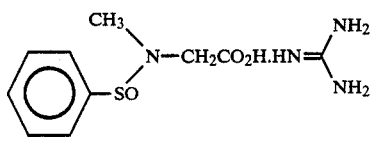

(10) 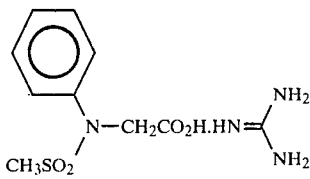

(11) 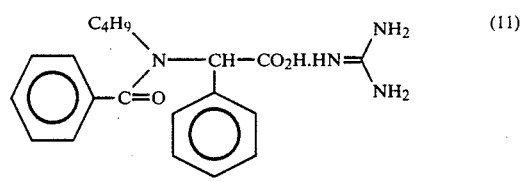

(12) 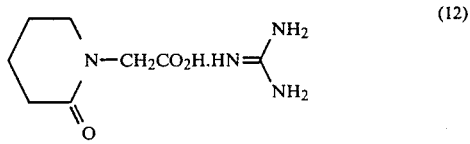

(13) 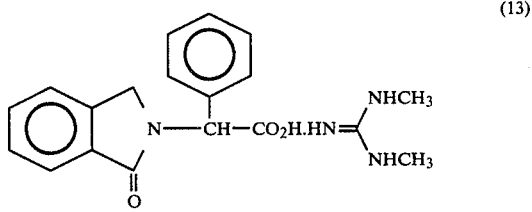

Specific synthesis examples of the base precursors used in the present invention are described below.

SYNTHESIS EXAMPLE 1

Synthesis of base precursor (1)

43.8 g of N-phenylaminoacetic acid was added to 500 ml of water. 21.8 g of sodium nitrite was added to this mixture while cooling with ice and then the mixture was stirred while cooling for 2 hours. 30.8 g of nitroso derivative was obtained by removing crystals from the reaction solution by filtration. 15.0 g of this crystal was solved in 120 ml of methanol and this methanol solution was filtered after the addition of 5 g of an active chacoal and stirring for 10 minutes. The filtrate was neutralized by the addition of a 30% aqueous solution of 6.7 g of guanidine carbonate. Crystals were obtained by concentration of the reaction mixture and washed with isopropyl alcohol. 14.7 g of the above-mentioned base precursor (1) having a melting point of 134° C. to 136° C. (decomposition) was obtained.

SYNTHESIS EXAMPLE 2

Synthesis of base precursor (6)

198 g of KOH was dissolved in 500 ml of methanol. The solution was stirred at a temperature of 70° C. for half an hour after the addition of 210 g of benzil. The reaction solution was poured into 1.5 l of water at 60° C. and 350 ml of 35% hydrochloric acid was added to this mixture. After removing the precipitated crystals by filtration, 205.9 g of 2,2-diphenyl-2-hydroxyacetic acid was recrystallized from a mixed solvent of 750 ml of methanol and 750 ml of water.

41.7 g of this obtained crystal and 8 g of acetonitrile were added to 170 ml of diethyl ether and this ether solution was cooled with ice. 170 ml of 97% concentrated sulfuric acid was added into this solution at 10° C. The solution was left at room temperature overnight.

The reaction solution was distilled while reducing the pressure to remove the ether and the residue was added to ice water. 47.8 g of 2-acetylamino-2,2-diphenylacetic acid was obtained by drying the precipitated crystal in the air.

26.9 g of this crystal was neutralized in methanol by use of a 30% aqueous solution of 9 g of guanidine carbonate and the obtained crystals were collected by filtration. 24.0 g of the above-mentioned base precursor (6) having a melting point of 180° C. to 182° C. (decomposition) was obtained.

It is preferred that the base precursor of the present invention be added in the form of a salt. Further the base precursor can be obtained by a neutralization reaction of an acid group and a base group in a binder.

Silver halide is preferably used in the heat-developable light-sensitive material of the present invention. The silver halide includes silver chloride, silver chlorobromide, silver chloroiodide, silver bromide, silver iodobromide, silver chloroiodobromide, and silver iodide, etc.

The silver halide, for example, the silver iodobromide is prepared by first adding a silver nitrate solution to a potassium bromide solution to form silver bromide particles and then adding potassium iodide to the mixture.

Two or more kinds of silver halides in which a particle size and/or a halogen composition are different from each other may be used in mixture.

An average particle size of the silver halide used in the present invention is preferably from 0.001 μm to 10 μm and more preferably from 0.001 μm to 5 μm.

The silver halide used in the present invention may be used as is. However, it may be chemically sensitized with a chemical sensitizing agent such as compounds of sulfur, selenium or tellurium, etc., or compounds of gold, platinum, palladium, rhodium or iridium, etc., a reducing agent such as tin halide, etc., or a combination thereof. The details thereof are described in T. H. James, *The Theory of the Photographic Process*, The Fourth Edition, Chapter 5, pages 149-169.

In the particularly preferred embodiment of the heat-developable light-sensitive material of the present invention, an organic silver salt is used together with silver halide. The organic silver salt forms a silver image by reacting with an image forming substance or a reducing agent coexisting, if necessary, with the image forming substance, when it is heated to a temperature of above 80° C. and, preferably, above 100° C. in the presence of exposed silver halide. By coexisting with the organic silver salt, a light-sensitive material which provides higher color density can be obtained.

The silver halide used in this case does not always need to have the characteristic that the silver halide contains a pure silver iodide crystal in the case of using the silver halide alone. Any silver halide which is known in the art can be used.

Examples of such organic salts include those described in Japanese Patent Application (OPI) No. 58543/83.

A silver salt of an organic compound having a carboxyl group can be used. Typical examples thereof include a silver salt of an aliphatic carboxylic acid and a silver salt of an aromatic carboxylic acid.

In addition, a silver salt of a compound containing a mercapto group or a thione group and a derivative thereof can be used.

Further, a silver salt of a compound containing an imino group can be used. Examples of these compounds include a silver salt of benzotriazole and a derivative thereof as described in Japanese Patent Publication Nos. 30270/69 and 18416/70, for example, a silver salt of benzotriazole, a silver salt of an alkyl substituted benzotriazole such as a silver salt of methylbenzotriazole, etc., a silver salt of a halogen substituted benzotriazole such as a silver salt of 5-chlorobenzotriazole, etc., a silver salt of carboimidobenzotriazole such as a silver salt of butylcarboimidobenzotriazole, etc., a silver salt of 1,2,4-triazole or 1-H-tetrazole as described in U.S. Pat. No. 4,220,709, a silver salt of carbazole, a silver salt of saccharin, a silver salt of imidazole and an imidazole derivative, and the like.

Moreover, a silver salt as described in *Research Disclosure*, Vol. 170, No. 17029 (June, 1978) and an organic metal salt such as copper stearate, etc., are the organic metal salt oxidizing agent capable of being used in the present invention.

Methods of preparing these silver halide and organic silver salt oxidizing agents and manners of blending them are described in *Research Disclosure*, No. 17029, Japanese Patent Application (OPI) Nos. 32928/75 and 42529/76, U.S. Pat. No. 3,700,458, and Japanese Patent Application (OPI) Nos. 13224/74 and 17216/75.

A suitable coating amount of the light-sensitive silver halide and the organic silver salt oxidizing agent employed in the present invention is in a total of from 50 mg/m$^2$ to 10 g/m$^2$ calculated as an amount of silver.

In the case of using silver halide in the heat-developable material of the present invention, it is remarkably effective to use the base precursor of the present invention together with the light-sensitive silver halide which is spectrally sensitized. That is, the effect to highten the image density is remarkable when the base precursor is used together with the light-sensitive silver halide which is spectrally sensitized.

The silver halide is spectrally sensitized with methine dyes or other dyes. Suitable dyes which can be employed include cyanine dyes, merocyanine dyes, complex cyanine dyes, complex merocyanine dyes, holopolar cyanine dyes, hemicyanine dyes, styryl dyes, and hemioxonol dyes. Of these dyes, cyanine dyes, merocyanine dyes and complex merocyanine dyes are particularly useful. Any conventionally utilized nucleus for cyanine dyes, such as basic heterocyclic nuclei, is applicable to these dyes. That is, a pyrroline nucleus, an oxazoline nucleus, a thiazoline nucleus, a pyrrole nucleus, an oxazole nucleus, a thiazole nucleus, a selenazole nucleus, an imidazole nucleus, a tetrazole nucleus, a pyridine nucleus, etc., and further, nuclei formed by condensing alicyclic hydrocarbon rings with these nuclei and nuclei formed by condensing aromatic hydrocarbon rings with these nuclei, that is, an indolenine nucleus, a benzindolenine nucleus, an indole nucleus, a benzoxazole nucleus, a naphthoxazole nucleus, a benzothiazole nucleus, a naphthothiazole nucleus, a benzoselenazole nucleus, a benzimidazole nucleus, a quinoline nucleus, etc., are appropriate. The carbon atoms of these nuclei may also be substituted.

With merocyanine dyes and complex merocyanine dyes, as nuclei having a ketomethylene structure, 5- or 6-membered heterocyclic nuclei such as a pyrazolin-5-one nucleus, a thiohydantoin nucleus, a 2-thiooxazolidin-2,4-dione nucleus, a thiazolidin-2,4-dione nucleus, a rhodanine nucleus, a thiobarbituric acid nucleus, etc., may also be applicable.

These sensitizing dyes can be employed individually, and can also be employed in combination thereof. A combination of sensitizing dyes is often used, particularly for the purpose of supersensitization.

A suitable amount of the specific sensitizing dye is from 0.001 g to 20 g, preferably 0.01 g to 2 g, per 100 g of silver used for preparing an emulsion.

The base presursor of the present invention can be used over a wide range. An effective range is not more than 50% by weight based on the total weight of the dried coating layer on the support in the light-sensitive material, and preferably, the range is from 0.01% by weight to 40% by weight.

According to the present invention, silver can be utilized as an image forming substance. Further, various other image forming substances can be employed in various image forming processes.

For instance, couplers capable of forming color images upon reaction with an oxidation product of a developing agent, which are used in liquid development processing widely known hitherto, can be employed. For example, as magenta couplers, there are 5-pyrazolone couplers, pyrazolobenzimidazole couplers, cyanoacetylcoumarone couplers and open chain acrylacetonitrile couplers, etc. As yellow couplers, there are acrylacetamide couplers (for example, benzoylacetanilides and pivaloylacetanilides), etc. As cyan couplers, there are naphthol couplers and phenol couplers, etc. It is preferred that these couplers be non-diffusible substances which have a hydrophobic group called a ballast group in the molecule thereof or be polymerized substances. The couplers may be any of the 4-equivalent type and 2-equivalent type to silver ions. Further, they may be colored couplers having a color correction effect or couplers which release a development inhibitor at development processing (so-called DIR couplers).

Further, dyes for forming positive color images by a light-sensitive silver dye bleach processes, for example, those as described in *Research Disclosure*, No. 14433, pages 30-32 (April, 1976), ibid., No. 15227, pages 14-15 (December, 1976) and U.S. Pat. No. 4,235,957, etc., can be employed.

Moreover, leuco dyes as described, for example, in U.S. Pat. Nos. 3,985,565 and 4,022,617, etc., can be used.

Further, dyes to which a nitrogen-containing hetereocyclic group has been introduced as described in *Research Disclosure*, No. 16966, pages 54-58 (May, 1978), may be employed.

In addition, dye providing substances which release a mobile dye by utilizing a coupling reaction of a reducing agent oxidized by an oxidation reduction reaction with a silver halide or an organic silver salt at high temperature as described in European Pat. No. 79,056, West German Pat. No. 3,217,853, European Pat. No. 67,455, etc., and dye providing substances which release a mobile dye as a result of an oxidation reduction reaction with a silver halide or an organic silver salt at high temperature as described in European Pat. No. 76,492, West German Pat. No. 3,215,485, European Pat. No. 66,282, Japanese Patent Application Nos. 28928/83 and 26008/83, etc., can be employed.

Preferred dye providing substances which can be employed in these processes can be represented by the following formula (CI):

(Dye-X')-Y    (CI)

wherein Dye represents a dye which becomes mobile when it is released from the molecule of the dye providing substance and a preferred dye has a hydrophilic group. Examples of the dye which can be used include azo dyes, azomethine dyes, anthraquinone dyes, naphthoquinone dyes, styryl dyes, nitro dyes, quinoline dyes, carbonyl dyes and phthalocyanine dyes, etc. These dyes can also be used in the form of having temporarily shorter wavelengths, the color of which is recoverable in the development processing.

Specifically, the dyes as described in European Patent Application (OPI) No. 76,492 can be used.

X' represents a simple bond or a connecting group. Examples of X' include —NR'— (wherein R' represents a hydrogen atom, an alkyl group, or a substituted alkyl group), —SO$_2$—, —CO—, an alkylene group, a substituted alkylene group, a phenylene group, a substituted phenylene group, a naphthylene group, a substituted naphthylene group, —O—, —SO—, or a group derived by combining together two or more of the foregoing groups.

Y represents a group which releases Dye in correspondence or countercorrespondence to light-sensitive silver salts having a latent image distributed imagewise, the diffusibility of Dye released being different from that of the compound represented by (Dye-X')-Y.

The group represented by Y is now explained in detail.

Y in formula (CI) described above is selected so that the compound represented by formula (CI) becomes a non-diffusible image-forming compound which is oxidized and self-cleaved as result of development to provide a diffusible dye.

An example of Y effective for this type of compound is an N-substituted sulfamoyl group. An example of Y is a group represented by formula (CII)

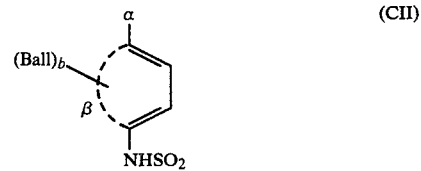

(CII)

wherein β represents a non-metallic atomic group necessary for forming a benzene ring, said benzene ring may be condensed with a carbon ring or a heterocyclic ring to form, for example, a naphthalene ring, a quinoline ring, a 5,6,7,8-tetrahydronaphthalene ring, a chroman ring, etc; α represents a group represented by —OG$^{11}$ or —NHG$^{12}$ (wherein G$^{11}$ represents a hydrogen atom or a group forming a hydroxy group by hydrolysis, and G$^{12}$ represents a hydrogen atom, an alkyl group having from 1 to 22 carbon atoms, or a hydrolyzable group); Ball represents a ballast group; and b represents an integer of from 0 to 2.

Practical examples of Y are described in Japanese Patent Application (OPI) Nos. 33,826/'73 and 50,736/'78.

Another example of Y suitable for the compound of this type is the group represented by formula (CIII)

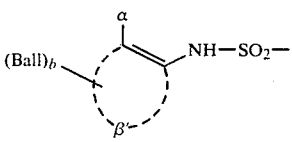

(CIII)

wherein Ball, α, and b have the same meaning as in the case of formula (CII) and β' represents an atomic group necessary for forming a carbocyclic ring, such a benzene ring, and said benzene ring may be condensed with a carbon ring or a heterocyclic ring to form a naphthalene ring, a quinoline ring, a 5,6,7,8-tetrahydronaphthalene ring, a chroman ring, etc. Practical examples of Y of this type are described in Japanese Patent Application (OPI) Nos. 113,624/'76; 12,642/'81; 16,130/'81; 16,131/'81; 4043/'82; 650/'82 and U.S. Pat. No. 4,053,312.

Furthermore, still other example of Y suitable for the compound of this type is the group represented by formula (CIV)

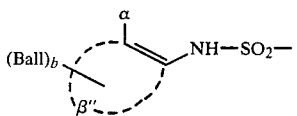

(CIV)

wherein Ball, α, and b have the same meaning as in the case of formula (CII) and β'' represents an atomic group forming a heterocyclic ring such as a pyrazole ring, a pyridine ring, etc., said heterocyclic ring may be condensed with a carbon ring or a heterocyclic ring. Practical examples of Y of this type are described in Japanese Patent Application (OPI) No. 104,343/'76.

Furthermore, other example of Y suitable for the compound of this type is the group represented by formula (CV)

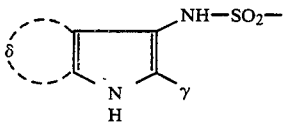

(CV)

wherein, γ preferably represents a hydrogen atom, a substituted or unsubstituted alkyl group, a substituted or unsubstituted aryl group, a substituted or unsubstituted heterocyclic ring group, or —CO—$G^{21}$ (wherein $G^{21}$ represents —$OG^{22}$, —S—$G^{22}$, or

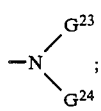

wherein $G^{22}$ represents a hydrogen atom, an alkyl group, a cycloalkyl group, or an aryl group; $G^{23}$ represents a hydrogen atom, an alkyl group, a cycloalkyl group, an aryl group, or an acyl group induced from an aliphatic carboxylic acid, an aromatic carboxylic acid or sulfonic acid; and $G^{24}$ represents a hydrogen atom or an unsubstituted or substituted alkyl group); and δ represents a residue completing a condensed benzene ring.

Practical examples of Y of this kind are described in Japanese Patent Application (OPI) Nos. 104,343/'76; 46,730/'78; 130,122/'79; 85,055/'82, etc.

Moreover, as Y suitable for the compound of this type, there is the group represented by formula (CVI)

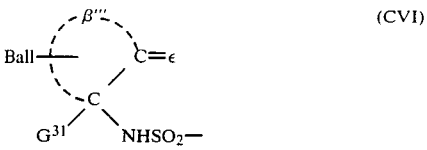

(CVI)

wherein Ball is same as the case of formula (CII); ε represents an oxygen atom or =$NG^{32}$ group (wherein $G^{32}$ represents a hydroxy group or an amino group which may have a substituent); in this case, examples of the compound $H_2N$—$G^{32}$ from which the =$NG^{32}$ group is derived include hydroxylamine, hydrazines, semicarbazides, thiosemicarbazides, etc.; β''' represents an atomic group forming a 5-membered, 6-membered or 7-membered saturated or unsaturated non-aromatic hydrocarbon ring; and $G^{31}$ represents a hydrogen atom or a halogen atom such as fluorine, chlorine, bromine, etc. Practical examples of Y of this type are described in Japanese Patent Application (OPI) Nos. 3819/'78; 48,534/'79, etc.

Examples of Y of the compound of this type include groups as described, for example, in Japanese Patent Publication Nos. 32,129/'73 and 39,165/'73; Japanese Patent Application (OPI) No. 64,436/'74; U.S. Pat. No. 3,443,934, etc.

As still another example of Y, there is the group represented by formula (CVII)

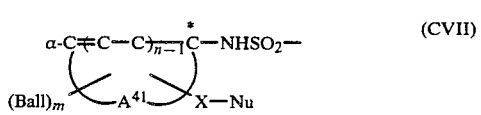

(CVII)

wherein $A^{41}$ represents an atomic group necessary for forming an aromatic ring; Ball represents an organic immobilizing group disposed on an aromatic ring; m represents an integer of 1 or 2; when m is 2, said Ball groups may be the same or different; X represents a divalent organic group having from 1 to 8 carbon atoms and forms a 5- to 12-membered ring with a nucleophilic group (Nu) and an electrophilic center (the carbon atom with *) formed by oxidation; Nu represents a nucleophilic group; n represents an integer of 1 or 2; and α is the same as in the case of above formula (CII). Practical examples of Y of this kind are described in Japanese Patent Application (OPI) No. 20735/'82.

Furthermore, as other type of the compound shown by formula which causes self ring closure in the presence of a base to release a diffusible dye, but substantially does not release the dye when the compound reacts with the oxidation product of a developing agent.

Examples of Y effective as a compound of this type include groups represented by formula (CVIII)

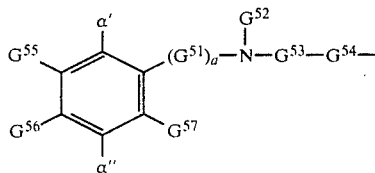 (CVIII)

wherein α' represents an oxidizable nucleophilic group such as a hydroxy group, a primary or secondary amino group, a hydroxyamino group, a sulfonamido group, etc., or a precursor thereof; α" represents a dialkylamino group or an optional group defined in regard to α'; $G^{51}$ represents an alkylene group having from 1 to 3 carbon atoms; a represents 0 or 1; $G^{52}$ represents a substituted or unsubstituted alkyl group having from 1 to 40 carbon atoms or a substituted or unsubstituted aryl group having from 6 to 40 carbon atoms; $G^{53}$ represents an electrophilic group such as —CO—, —CS—, etc.; $G^{54}$ represents an oxygen atom, a sulfur atom, a selenium atom, and it may be substituted by a hydrogen atom, a substituted or unsubstituted alkyl group having from 1 to 10 carbon atoms, or an aromatic residue having 6 to 20 carbon atoms; $G^{55}$ and $G^{57}$ each represents a hydrogen atom, a halogen atom, a group containing a carbonyl group (e.g., an amido group and —COOH), a sulfamoyl group, a sulfonamide group, an alkyloxy group having from 1 to 40 carbon atoms or represents the same group as defined for $G^{52}$, and $G^{55}$ and $G^{56}$ together may form a ring, or $G^{56}$ may be

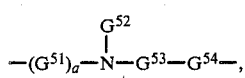

wherein at least one of $G^{52}$, $G^{55}$, $G^{56}$ and $G^{57}$ represents a ballast group. Examples of Y of the compound of this type include groups as described, for example, in Japanese Patent Application (OPI) No. 63,618/'76.

Examples of Y suitable for the compound of this type include groups represented by formulae (CIX) and (CX):

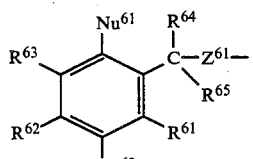 (CIX)

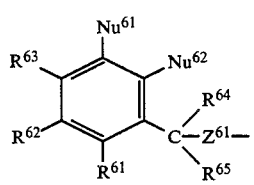 (CX)

wherein $Nu^{61}$ and $Nu^{62}$ (which may be the same or different) each represents a nucleophilic group or a precursor thereof; $Z^{61}$ represents a divalent atomic group which is electrically negative to the carbon atom to which $R^{64}$ and $R^{65}$ are substituted; $R^{61}$, $R^{62}$, and $R^{63}$ each represents a hydrogen atom, a halogen atom, an alkyl group, an alkoxy group, or an acylamino group; when said $R^{61}$ and $R^{62}$ are adjacently disposed on a ring, they may form a condensed ring with the remaining molecule, or said $R^{62}$ and $R^{63}$ may form a condensed ring with the remaining part of the molecule; $R^{64}$ and $R^{65}$ (which may be the same or different) each represents a hydrogen atom, a hydrocarbon group or a substituted hydrocarbon group; and a sufficiently large ballast group, Ball exists at least on the substituent $R^{61}$, $R^{62}$, $R^{63}$, $R^{64}$, or $R^{65}$ for making immobile the aforesaid compound. Practical examples of Y of this kind are described in Japanese Patent Application (OPI) Nos. 69,033/'78 and 130,927/'79.

Also, another Y suitable for the compound of this type is the group represented by formula (CXI)

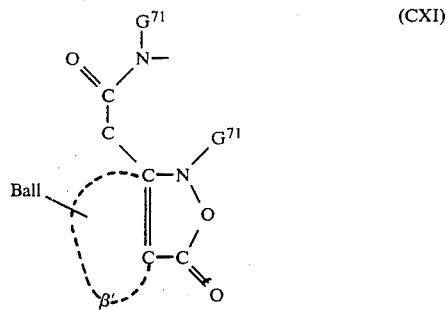 (CXI)

wherein Ball and β' are same as defined in formula (CIII); $G^{71}$ represents an alkyl group or a substituted alkyl group. Practical examples of Y of this kind are described in Japanese Patent Application (OPI) Nos. 111,628/'74 and 4,819/'77.

Moreover, another example of the compound shown by formula (CI) above is a non-diffusible image-forming compound which does not release a dye by itself, but releases a dye when the compound reacts with a reducing agent. In this case, it is preferred to use a compound mediating the redox reaction (a so-called electron donor) together with the image-forming compound.

As an example of Y effective for the compound of this type, there is a group shown by formula (CXII)

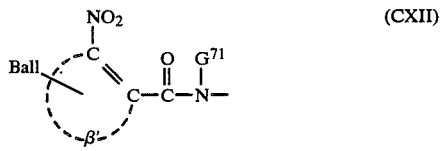 (CXII)

wherein Ball and β' are same as defined in formula (CIII) and $G^{71}$ represents an alkyl group or a substituted alkyl group. Practical examples of Y of this kind are described in Japanese Patent Application (OPI) Nos. 35,533/'78 and 110,827/'78.

As still other example of Y suitable for the compound of this type, there is the group shown by formula (CXIII)

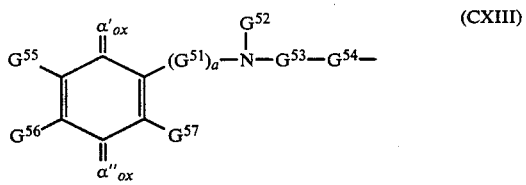 (CXIII)

wherein α'$_{ox}$ and α"$_{ox}$ each represents a group giving α' or α" by reduction and α', α", $G^{51}$, $G^{52}$, $G^{53}$, $G^{54}$, $G^{55}$, $G^{56}$, $G^{57}$, and a are same as the case of formula (CVIII). Practical examples of Y of this kind are described in Japanese Patent Application (OPI) No. 110,827/'78 and U.S. Pat. Nos. 4,356,249 and 4,358,525.

Other examples of Y suitable for the compound of this type include groups represented by formulae (CXIV A) and (CXIV B)

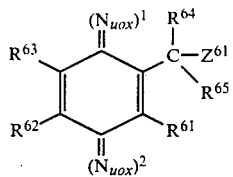
(CXIV A)

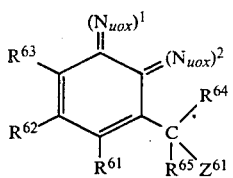
(CXIV B)

wherein $(N_{uox})^1$ and $(N_{uox})^2$, which may be the same or different, each represents an oxidized nucleopholic group and other symbols are the same as in the cases of formulae (CIX) and (CX). Practical examples of Y of this kind are described in Japanese Patent Application (OPI) Nos. 130,927/'79 and 164,342/'81.

In the patent specifications cited in regard to formulae (CXII), (CXIII), (CXIV A) and (CXIV B), electron donors which can be used with the aforesaid compounds are described.

Also, as other type of compound shown by general formula (CI), there is further a linked donor acceptor compound (LDA compound). This compound is a nondiffusible image-forming compound which causes a donor-acceptor reaction in the presence of a base to release a diffusible dye, but does not substantially release the dye when the compound reacts with the oxidation product of a developing agent.

Example of Y effective for the compound of this type, there is, for example, the group shown by following formula (CXV). Practical examples of Y of this kind are described in British Patent Application (published) No. 2,140,927.

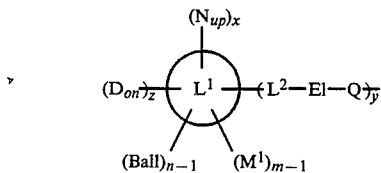
(CXV)

wherein n, x, y, and z are 1 or 2; m representats an integer of 1 or more; Don represents a group containing an electron donor or a precursor moiety thereof; $L^1$ represents an organic group connecting Nup and $-L^2$-El-Q or Don; Nup represents a precursor for a nucleophilic group; El represents an electrophilic center; Q represents a divalent group; Ball represents a ballast group; $L^2$ represents a linkage group and $M^1$ represents an optional substituent.

The ballast group is an organic ballast group capable of rendering the dye image-forming compound nondiffusible, and it is preferred that the ballast group is a group containing a hydrophobic group having from 8 to 32 carbon atoms. Such an organic ballast group is bonded to the dye image-forming compound directly or through a linkage group (e.g., an imino bond, an ether bond, a thioether bond, a carbonamido bond, a sulfonamido bond, a ureido bond, an ester bond, an imido bond, a carbamoyl bond, a sulfamoyl bond, etc., either singly or as a combination thereof).

The dye providing substances may be used solely or a combination of two or more. In the case of using a mixture, the same color may be formed by using two or more dyes, or black may be formed using two or more days.

Practical examples of the image forming substance for use in this invention are described in the patent specifications indicated above. Example compounds are shown below.

For example, the dye providing substances shown by foregoing formula (CI) are as follows.

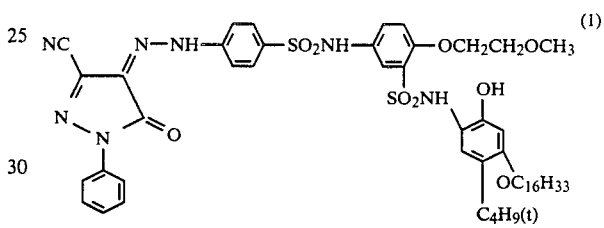
(1)

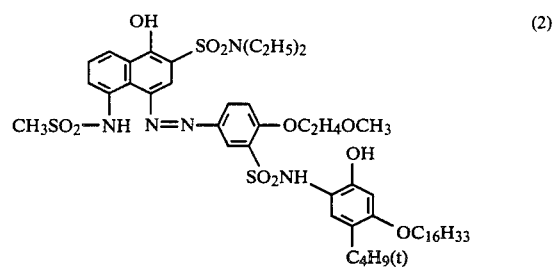
(2)

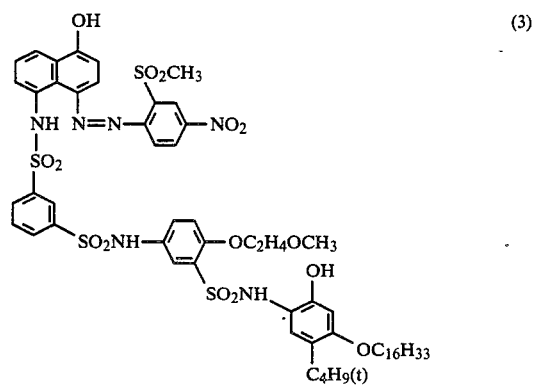
(3)

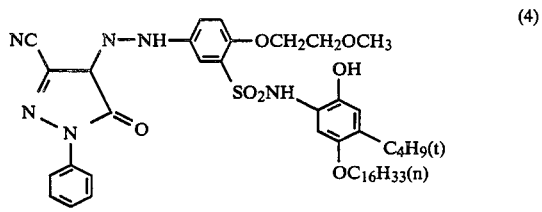
(4)

(5) 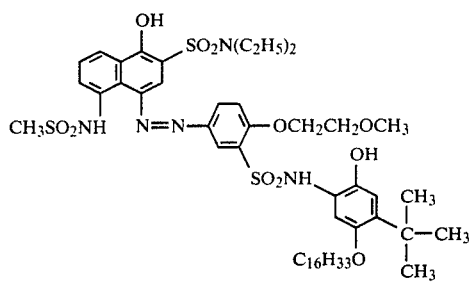
(6) 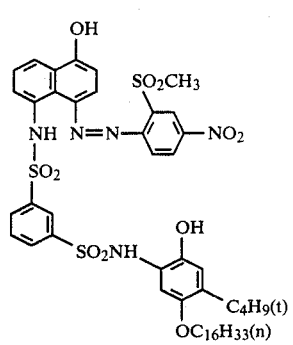
(7) 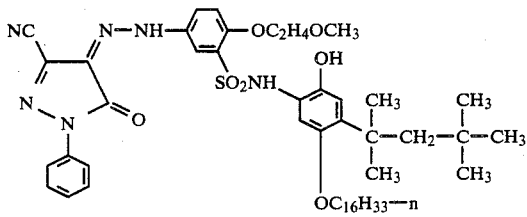
(8) 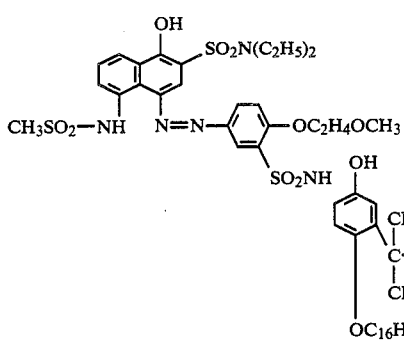
(9) 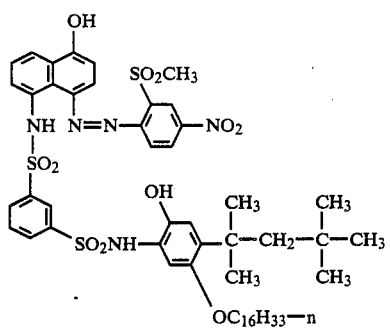
(10) 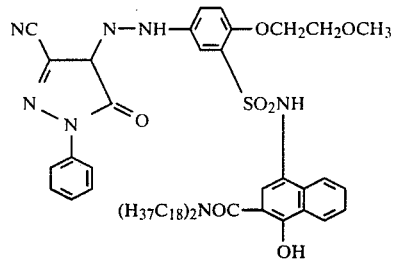
(11) 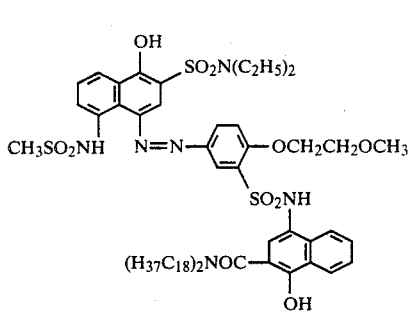
(12) 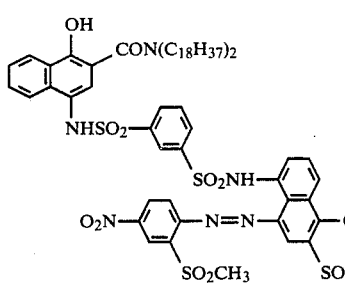
(13) 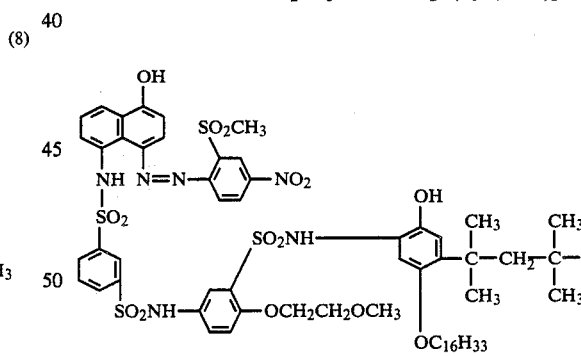
(14) 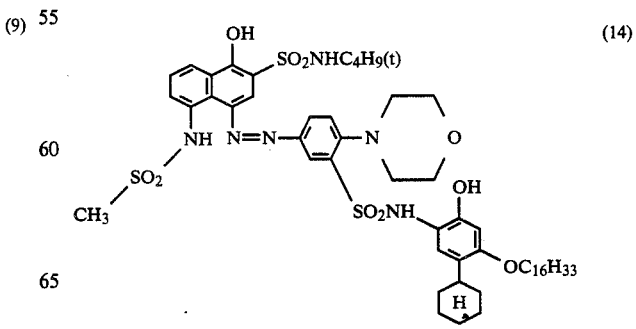

-continued

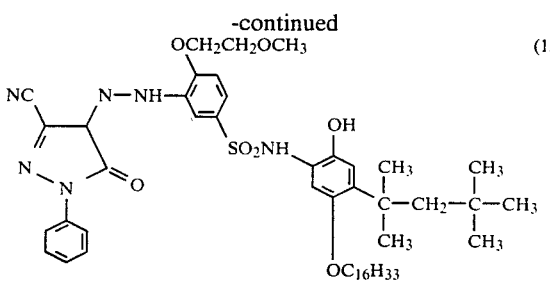

The foregoing compounds are described for the illustrative purposes, and the present invention is not limited thereto.

Most of the dye image forming substances described above form an imagewise distribution of a mobile dye corresponding to exposure in light-sensitive materials by heat development. Methods for transfer of such an image forming dye to a dye fixing material (so-called a diffusion transfer) to visualize the same are described in the patents cited above and Japanese Patent Application No. 42092/83 and 55172/83.

The dye providing substance used in the present invention can be introduced into a layer of the light-sensitive material by known methods such as a method as described in U.S. Pat. No. 2,322,027. In this case, an organic solvent having a high boiling point or an organic solvent having a low boiling point as described below can be used. For example, the dye providing substance is dispersed in a hydrophilic colloid after dissolved in an organic solvent having a high boiling point, for example, a phthalic acid alkyl ester (for example, dibutyl phthalate, dioctyl phthalate, etc.), a phosphoric acid ester (for example, diphenyl phosphate, triphenyl phosphate, tricresyl phosphate, dioctylbutyl phosphate, etc.), a citric acid ester (for example, tributyl acetylcitrate, etc.), a benzoic acid ester (for example, octyl benzoate, etc.), an alkylamide (for example, diethyl laurylamide, etc.), a fatty acid ester (for example, dibutoxyethyl succinate, dioctyl azelate, etc.), a trimesic acid ester (for example, tributyl trimesate, etc.), etc., or an organic solvent having a boiling point of about 30° C. to 160° C., for example, a lower alkyl acetate such as ethyl acetate, butyl acetate, etc., ethyl propionate, secondary butyl alcohol, methyl isobutyl ketone, β-ethoxyethyl acetate, methyl cellosolve acetate, cyclohexanone, etc. The above described organic solvents having a high boiling point and organic solvents having a low boiling point may be used as a mixture thereof.

Further, it is possible to use a dispersion method using a polymer as described in Japanese Patent Publication No. 39853/76 and Japanese Patent Application (OPI) No. 59943/76. Moreover, various surface active agents can be used when the dye providing substance is dispersed in a hydrophilic colloid. For this purpose, the surface active agents illustrated in other part of the specification can be used.

In the present invention, if necessary, a reducing agent may be used.

The reducing agents used in the present invention include the following compounds.

Hydroquinone compounds (for example, hydroquinone, 2,5-dichlorohydroquinone, 2-chlorohydroqinone, etc.), aminophenol compounds (for example, 4-aminophenol, N-methylaminophenol, 3-methyl-4-aminophenol, 3,5-dibromoaminophenol, etc.), catechol compounds (for example, catechol, 4-cyclohexylcatechol, 3-methoxycatechol, 4-(N-octadecylamino)catechol, etc.), phenylenediamine compounds (for example, N,N-diethyl-p-phenylenediamine, 3-methyl-N,N-diethyl-p-phenylenediamine, 3-methoxy-N-ethyl-N-ethoxy-p-phenylenediamine, N,N,N',N'-tetramethyl-p-phenylenediamine, etc.).

Various combinations of developing agents as described in U.S. Pat. No. 3,039,869 can also be used.

In the present invention, an amount of the reducing agent added is from 0.01 mol to 20 mols per mol of silver and more preferably from 0.1 mol to 10 mols per mol of silver.

The binder which can be used in the present invention can be employed individually or in a combination thereof. A hydrophilic binder can be used as the binder according to the present invention. The typical hydrophilic binder is a transparent or translucent hydrophilic colloid, examples of which include a natural substance, for example, protein such as gelatin, a gelatin derivative, a cellulose derivative, etc., a polysaccharide such as starch, gum arabic, etc., and a synthetic polymer, for example, a water-soluble, polyvinyl compound such as polyvinyl alcohol, polyvinyl pyrrolidone, acrylamide polymer, etc. Another example of the synthetic polymer compound is a dispersed vinyl compound in a latex form which is used for the purpose of increasing dimensional atability of a photographic material.

Further, in the present invention, it is possible to use a compound which activates development simultaneously while stabilizing the image. Particularly it is preferred to use isothiuroniums including 2-hydroxyethylisothiuronium trichloroacetate as described in U.S. Pat. No. 3,301,678, bisisothiuroniums including 1,8-(3,6-dioxaoctane)-bis(isothiuronium trifluoroacetate), etc., as described in U.S. Pat. No. 3,669,670, thiol compounds as described in West German Patent Application (OLS) No. 2,162,714, thiazolium compounds such as 2-amino-2-thiazolium trichloroacetate, 2-amino-5-bromoethyl-2-thiazolium trichloroacetate, etc., as described in U.S. Pat. No. 4,012,260, compounds having α-sulfonylacetate as an acid part such as bis(2-amino-2-thiazolium)-methylenebis(sulfonylacetate), 2-amino-2-thiazolium phenylsulfonylacetate, etc., as described in U.S. Pat. No. 4,060,420, and compounds having 2-carboxycarboxamide as an acid part as described in U.S. Pat. No. 4,088,496.

The light-sensitive material of the present invention can contain a toning agent as occasion arises. Effective toning agents are 1,2,4-triazoles, 1-tetrazoles, thiouracils, 1,3,4-thiadiazoles, and like compounds. Examples of preferred toning agents include 5-amino-1,3,4-thiadiazole-2-thiol, 3-mercapto-1,2,4-triazole, bis(dimethylcarbamyl)disulfide, 6-methylthiouracil, 1-phenyl-2-tetrazoline-5-thione, and the like. Particularly effective toning agents are compounds which can impart a black color tone to images.

The content of such a toning agent as described above, though depending upon the kind of a heat developable light-sensitive material used, processing conditions, desired images and various other factors, generally ranges from about 0.001 to 0.1 mol per mol of silver in the photosensitive material.

In the present invention, it is particularly preferred to use various bases or base precursors as dye releasing assistants.

The bases or precursors thereof can be used in a light-sensitive material and/or a dye fixing material. In the case of incorporating them in a light-sensitive material, it is particularly advantageous to use base precursors, and to add them to the layer containing the acid precursors or a layer adjacent to the layer containing the acid precursors. The term "base precursor" used herein means a substance which releases a base component by heating to a temperature of development, where the base component released may be any inorganic base or organic base.

As examples of preferred bases, there are, as inorganic bases, hydroxides, secondary or tertiary phosphates, borates, carbonates, quinolinates and metaborates of alkali metals or alkaline earth metals; ammonium hydroxide; quaternary alkylammonium hydroxides; and other metal hydroxides; etc., and, as organic bases, aliphatic amines, aromatic amines, heterocyclic amines, amidines, cyclic amidines, guanidines, cyclic guanidines, etc. In this present invention, compounds having a pKa value of 8 or more are particularly useful.

As the base precursors, substances which undergo reaction by heating to release a base, such as salts of an organic acid which is decarboxylated by heating to undergo decomposition and yield a base, or compounds which are decomposed by Lossen rearrangement or Beckmann rearrangement to release an amine, are used.

As preferred base precursors, there are precursors of the above described organic bases. For example, there are salts of thermally decomposable organic acids such as trichloroacetic acid, propiolic acid, cyanoacetic acid, sulfonylacetic acid, acetoacetic acid, etc., and salts of 2-carboxycarboxamide as described in U.S. Pat. No. 4,088,496, etc.

Specific examples of preferred bases are set forth below, but the present invention should not be construed as being limited to these compounds.

Lithium hydroxide, sodium hydroxide, potassium hydroxide, barium hydroxide, sodium carbonate, potassium carbonate, sodium quinolinate, potassium quinolonate, sodium secondary phosphate, potassium secondary phosphate, sodium pyrophosphate, potassium pyrophosphate, sodium metaborate, potassium metaborate, borax ammonium hydroxide, tetramethyl ammonium, tetrabutyl ammonium, ammonia, MeHN$_2$ (Me represents CH$_3$ hereinafter), Me$_2$NH, EtNH$_2$, (Et represents C$_2$H$_5$ hereinafter), Et$_2$NH, C$_4$H$_9$NH$_2$, (C$_4$H$_9$)$_2$NH, HOC$_2$H$_4$NH$_2$, (HOC$_2$H$_4$)$_2$NH, Et$_2$NCH$_2$CH$_2$OH, H$_2$NC$_2$H$_4$NH$_2$, MeNHC$_2$H$_4$NH$_2$, Me$_2$NC$_2$H$_4$NH$_2$, H$_2$NC$_3$H$_6$NH$_2$, H$_2$NC$_4$H$_8$NH$_2$, H$_2$NC$_5$H$_{10}$NH$_2$, Me$_2$NC$_2$H$_4$NMe$_2$, Me$_2$NC$_3$H$_6$NMe$_2$,

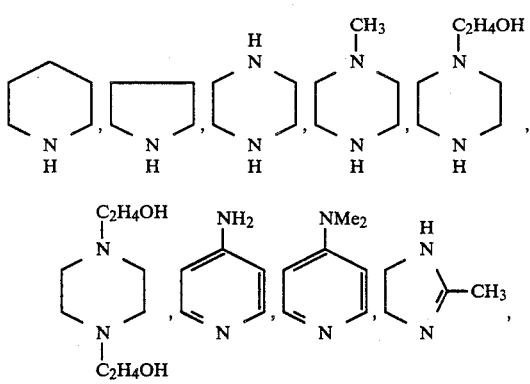

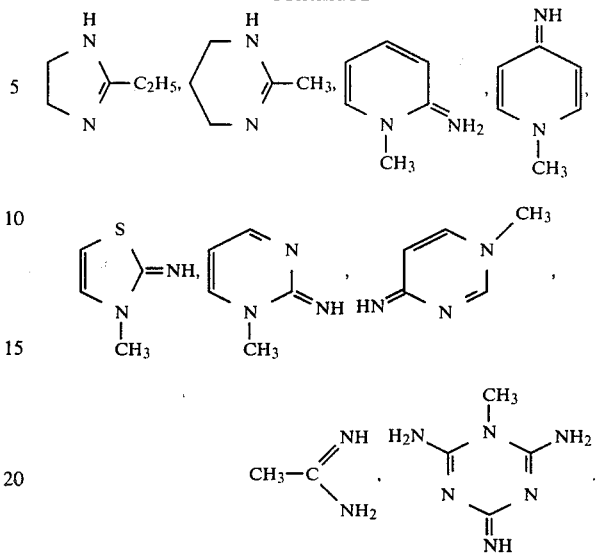

Specific examples of preferred base precursors are set forth below, but the present invention should not be construed as being limited thereto.

As trichloroacetic acid derivatives, there are guanidine trichloroacetic acid, piperidine trichloroacetic acid, morpholine trichloroacetic acid, p-toluidine trichloroacetic acid, 2-picoline trichloroacetic acid, etc. These compounds are believed to release a base by decarboxylation of the acid moiety.

In addition, base precursors as described in British Pat. No. 998,945, U.S. Pat. No. 3,220,846, Japanese Patent Application (OPI) No. 22625/75, etc., can be used.

As substances besides trichloroacetic acids, there are 2-carboxycarboxamide derivatives as described in U.S. Pat. No. 4,088,496, α-sulfonylacetate derivatives as described in U.S. Pat. No. 4,060,420, salts of propionic acid derivatives and bases as desdribed in Japanese Patent Application No. 55700/83, etc. Salts using alkal metal or an alkaline earth metal as a base component other than organic bases are also effective.

As other precursors, hydroxamic carbamates as described in Japanese Patent Application No. 31614/83 which form a nitrile, etc., are effective.

Further, amineimides as described in *Research Disclosure*, No. 15776 (May, 1977) and aldonic amides as described in Japanese Patent Application (OPI) No. 22615/75 are suitably used, because they form a base by decomposition at a high temperature.

These bases and base precursors can be used over a wide range. An effective range is not more than 50% by weight based on the total weight of the dried coating layers on the support in the light-sensitive material, and, preferably, a range of from 0.01% by weight to 40% by weight.

The above-described bases or base precursors can be used not only for the acceleration of dye release but also for other purposes such as the control of a pH value.

The above-described various ingredients to constitute a heat developable light-sensitive material can be arranged in arbitrary positions, if desired. For instance, one or more of the ingredients can be incorporated in one or more of the constituent layers of a light-sensitive material, if desired. In some cases, it is desired that particular portions of reducing agent, image stabilizing agent and/or additives should be distributed in a protective layer. As a result of the distribution in the above-described manner, migration of additives among constituent layers of a heat developable light-sensitive material can be reduced. Therefore, such distribution of additives is of advantege to some cases.

The heat developable light-sensitive materials of the present invention are effective in forming both negative or positive images. The negative or positive image can be formed depending mainly on the type of the light-sensitive silver halide. For instance, in order to produce direct positive images, internal image type silver halide emulsions described in U.S. Pat. Nos. 2,592,250, 3,206,313, 3,367,778 and 3,447,927, or mixtures of surface image type silver halide emulsions with internal image type silver halide emulsions as described in U.S. Pat. No. 2,996,382 can be used.

Various means of exposure can be used in the present invention. Latent images are obtained by imagewise exposure by radiant rays including visible rays. Generally, light sources used for conventional color prints can be used, examples of which include tungsten lamps, mercury lamps, halogen lamps such as iodine lamps, xenon lamps, laser light sources, CRT light sources, fluorescent tubes and light-emitting diodes, etc.

In the present invention, after the heat-developable color photographic material is exposed to light, the resulting latent image can be developed by heating the whole material to a suitably elevated temperature. A higher temperature or lower temperature can be utilized to prolong or shorten the heating time, if it is within the above described temperature range.

As the heating means, a simple heat plate, iron, heat roller, heat generator utilizing carbon or titanium white, etc., or analogues thereof may be used.

A support used in the light-sensitive material and the dye fixing material employed, if desired, according to the present invention is that which can endure at the processing temperature. As an ordinary support, not only glass, paper, metal or analogues thereof may be used, but also an acetyl cellulose film, a cellulose ester film, a polyvinyl acetal film, a polystyrene film, a polycarbonate film, a polyethylene terephthalate film, and a film related thereto or a plastic material may be used. Further, a paper support laminated with a polymer such as polyethylene, etc., can be used. The polyesters described in U.S. Pat. Nos. 3,634,089 and 3,725,070 are preferably used.

In the photographic light-sensitive material and the dye fixing material of the present invention, the photographic emulsion layer and other binder layers may contain inorganic or organic hardeners. It is possible to use chromium salts (chromium alum, chromium acetate, etc.), aldehydes (formaldehyde, glyoxal, glutaraldehyde, etc.), N-methylol compounds (dimethylolurea, methylol dimethylhydantoin, etc.), dioxane derivatives (2,3-dihydroxydioxane, etc.), active vinyl compounds (1,3,5-triacryloyl-hexahydro-s-triazine, 1,3-vinylsulfonyl-2-propanol, etc.), active halogen compounds (2,4-dichloro-6-hydroxy-s-triazine, etc.), mucohalogenic acids (mucochloric acid, mucophenoxychloric acid, etc.), etc., which are used individually or as a combination thereof.

The transfer of dyes from the light-sensitive layer to the dye fixing layer can be carried out using a dye transfer assistant.

The dye transfer assistants suitably used in a process wherein they are supplied from the outside include water and an aqueous solution containing sodium hydroxide, potassium hydroxide or an inorganic alkali metal salt. Further, a solvent having a low boiling point such as methanol, N,N-dimethylformamide, acetone, diisobutyl ketone, etc., and a mixture of such a solvent having a low boiling point with water or an alkaline aqueous solution can be used. The dye transfer assistant may be used by wetting the image receiving layer with the transfer assistant.

When the dye transfer assistant is incorporated into the light-sensitive material or the dye fixing material, it is not necessary to supply the transfer assistant from the outside. In this case, the above described dye transfer assistant may be incorporated into the material in the form of water of crystallization or microcapsules or as a precursor which releases a solvent at a high temperature.

More preferred process is a process wherein a hydrophilic thermal solvent which is solid at an ambient temperature and melts at a high temperature is incorporated into the light-sensitive material or the dye fixing material. The hydrophilic thermal solvent can be incorporated either into any of the light-sensitive material and the dye fixing material or into both of them. Although the solvent can be incorporated into any of the emulsion layer, the interlayer, the protective layer and the dye fixing layer, it is preferred to incorporate it into the dye fixing layer and/or adjacent layers thereto.

Examples of the hydrophilic thermal solvents include ureas, pyridines, amides, sulfonamides, imides, alcohols, oximes and other heterocyclic compounds.

Other compounds which can be used in the light-sensitive material of the present invention, for example, sulfamide derivatives, cationic compounds containing a pyridinium group, surface active agents having polyethylene oxide chains, sensitizing dye, antihalation and antiirradiation dyes, hardeners, mordants and so on, are those described in U.S. Pat. Nos. 4,500,626, 4,478,927 and 4,463,079, and Japanese Patent Application No. 28928/83 (corresponding to U.S. patent application Ser. No. 582,655 filed on Feb. 23, 1984) and U.S. Pat. No. 4,503,173. Methods for the exposure and so on cited in the above-described patents can be employed in the present invention also.

The invention will now be described by reference to specific examples thereof, but it is understood that these examples are not meant to be limiting.

Unless otherwise specified all percents, ratios, etc. are by weight.

EXAMPLE 1

The preparation of a silver iodobromide emulsion:

40 g of gelatin and 26 g of potassium bromide were dissolved in 3000 ml of water. This solution was stirred at 50° C. 200 ml of water containing 34 g of silver nitrate and 200 cc of the solution prepared by dissolving 0.02 g of the below-mentioned dye I into 300 cc of methanol were added in the above-mentioned gelatin solution over 10 minutes. Then in this solution 100 ml of water containing 3.3 g of potassium iodide was added over 2 minutes.

The thus prepared silver iodobromide emulsion was adjusted in pH, precipitated and freed of excess salt. It was then adjusted to pH 6.0, whereby 400 g of a silver iodobromide emulsion was obtained.

A method of preparing a gelatin dispersion of a coupler:

5 g of 2-dodecylcarbonyl-naphthol, 0.5 g of succinic acid 2-ethylhexyl ester sulfonic acid sodium salt and 2.5 g of tricresyl phosphate (TCP) were dissolved in 30 ml of ethyl acetate. A mixture of this solution and 100 g of a 10% aqueous solution of gelatin was stirred and dispersed by means of a homogenizer at 10,000 rpm for 10 minutes.

The coating solution comprised of the following was coated on a polyethylene terephthalate film support at a wet layer thickness of 60 μm and dryed, whereby the light-sensitive material was prepared.

| (a) | Silver iodobromide emulsion | 10 g |
| (b) | Gelatin dispersion of the coupler | 35 g |
| (c) | Base precursor (1) of the present invention | 0.24 g |
| (d) | Gelatin (10% aqueous solution) | 50 g |
| (e) | 17 cc of aqueous solution containing 0.2 g of 2,6-dichloro-p-aminophenol | |

This light-sensitive material was imagewise exposed by a tungsten lamp at 2000 lux for 5 seconds. Then the light-sensitive material was heated uniformly at 150° C. for 20 seconds on a heating block to obtain a negative cyan color image. The density of the image was measured using a Macbeth transmission densitometer (TD-504) to obtain the result of 0.20 of the minimum density and 1.96 of the maximum density. It is understood that the compound of the present invention gives high density.

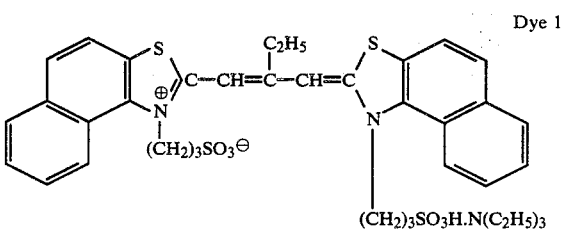

Dye 1

EXAMPLE 2

The silver iodobromide emulsion used in Example 1 and the following dispersion of a dye providing substance was used.

A method of preparing a dispersion of a dye providing substance:

5 g of the below-mentioned dye providing substance (1), 0.5 g of succinic acid sodium salt as a surface active agent and 5 g of tricresyl phosphate (TCP) were dissolved in 30 ml of ethylacetate at about 60° C. A mixture of this solution and 100 g of 10% aqueous solution of gelatin was stirred and dispersed by means of a homogenizer at 10,000 rpm for 10 minutes.

Dye providing substance (1)

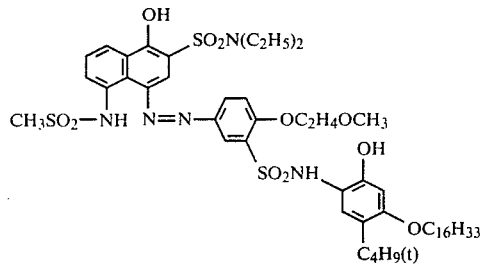

A method of preparing a light-sensitive coating solution is described in the following.

| (a) | Light-sensitive silver iodobromide emulsion (as shown in Example 1) | 25 g |
| (b) | Dispersion of dye providing substance (1) | 33 g |
| (c) | 5% Aqueous solution of the following compound | 4 ml |

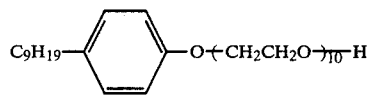

| (d) | 10% Aqueous solution of the following compound $H_2NSO_2N(CH_3)_2$ | 4 ml |
| (e) | Base precursor (1) of the present invention | 2.4 g |
| (f) | Water | 20 ml |

A mixture of the above components of (a) to (f) was dissolved under heating. Then the solution was coated on a polyethylene terephthalate film support at a wet layer thickness of 30 μm. This coating material was dryed and imagewise exposed by a tungsten lamp at 2000 lux for 10 seconds. Then the coating material was uniformly heated at 150° C. for 20 seconds on a heat block. This coating material is named A.

Sample B was prepared in the same method of Sample A except adding 1.8 g of guanidine trichloroacetic acid in substitution of the component (e) of the present invention.

A method of preparing an image receiving material containing an image receiving layer is described.

10% of poly(acrylate methyl-co-N,N,N-trimethyl-N-vinylbenzylammoniumchloride) (molar ratio of acrylate methyl to N,N,N-trimethyl-N-vinylbenzylammonium-chloride is 1:1) was dissolved into 200 ml of water and this aqueous solution was uniformly mixed with 100 g of 10% aqueous solution of lime-processed gelatin. This mixture was uniformly coated at a wet thickness of 90 μm on a paper support laminated with polyethylene containing titanium dioxide dispersed therein. This material was dryed to provide an image receiving layer.

The image receiving material was soaked in water and superimposed on each of the above heated Light-sensitive Materials A and B in such a manner that their layers were in contact with each other.

After heating at 80° C. for 6 minutes on the heated block, the image receiving material was separated from the light-sensitive material to obtain a negative magenta color image thereon. The density of the negative image was measured by a Macbeth reflective densitometer (RD-519) to obtain the below result.

| Sample No. | Dmax | Dmin |
|---|---|---|
| A (the present invention) | 1.97 | 0.24 |
| B (comparison) | 2.14 | 0.58 |

It is understood that the base precursor of the present invention gives a high maximum density and a low minimum density from the above result.

Samples A and B were stored at 60° C. for two days and processed in the same manner as the above. The minimum density and the maximum density of Sample A were 0.29 and 1.94, respectively but fog occurred throughout the surface of Sample B. It is understood that Sample A of the present invention has an improved storage stability.

EXAMPLE 3

The procedure of Example 2 was repeated except that the base precursor described in the following were used. The following result was obtained

| Sample No. | Base Precursor No. | Added Amount (g) | Fresh Dmax | Fresh Dmin | After storage at 60° C. for 2 days Dmax | After storage at 60° C. for 2 days Dmin |
|---|---|---|---|---|---|---|
| C | (6) | 3.2 | 2.01 | 0.22 | 1.96 | 0.27 |
| D | (10) | 2.8 | 2.09 | 0.24 | 2.03 | 0.35 |

It is understood that the base precursor of the present invention gives a high maximum density and a good storage stability.

EXAMPLE 4

An example in which an organic silver salt oxidizing agent was used is described below.

A method of preparing a silver benzotriazole emulsion:

Gelatin (28 g) and benzotriazole (13.2 g) were dissolved in water (3000 ml). The resulting solution was stirred at 40° C. A solution containing silver nitrate (17 g) dissolved in water (100 ml) was added over 2 minutes.

The resulting benzotriazole silver emulsion was adjusted in pH to form a precipitate and the excess salt was removed. The emulsion was adjusted to pH 6.0, thereby providing a silver benzotriazole emulsion (yield: 400 g).

Using this silver benzotriazole emulsion, a light-sensitive coating composition was prepared from the following.

| (a) | Silver iodobromide emulsion (as described in Example 1) | 20 g |
|---|---|---|
| (b) | Silver benzotriazole emulsion | 10 g |
| (c) | Dispersion of the dye providing substance (as described in Example 2) | 33 g |
| (d) | 5% Aqueous solution of the following compound | 10 ml |

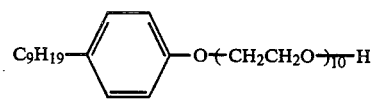

| (e) | 10% Aqueous solution of the following compound $H_2NSO_2N(CH_3)_2$ | 4 ml |
|---|---|---|
| (f) | Base precursor (1) of the present invention | 2.6 g |
| (g) | Gelatin dispersion of acid precursor below | 8 ml |
| (h) | Water | 12 ml |

Gelatin dispersion of the acid precursor described in (g) was prepared as below.

A compound described below (10 g) was added to a 1% aqueous solution of gelatin (100 g) and ground by use of glass beads (100 g) having a mean grain diameter of about 0.6 mm in a mill for ten minutes. The glass beads were filtrated out to obtain a gelatin dispersion of acid precursor.

After mixing (a) to (h) described above, a sample was prepared and processed in the same manner was as in Example 2. The result is shown below.

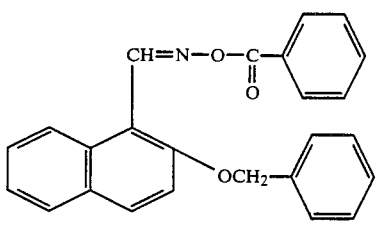

| Sample | Dmax | Dmin |
|---|---|---|
| (A') containing base precursor (1) (the present invention) | 2.18 | 0.23 |
| (B') containing guanidine trichloroacetic acid (control) | 2.33 | 0.61 |

It is understood that the base precursor of the present invention gives a high maximum density and a low minimum density.

Samples A' and B' were stored at 60° C. for two days and processed in the same manner as above. The minimum density and the maximum density of Sample A' were 0.26 and 2.20, respectively, but fog occurred throughout the surface of Sample B'. It is understood that Sample A' of the present invention has an improved storage stability.

EXAMPLE 5

A method of preparing a silver benzotriazole emulsion containing light-sensitive silver bromide:

Benzotriazole (6.5 g) and gelatin (10 g) were dissolved in water (1000 ml). The resulting solution was stirred at 50° C. A solution containing silver nitrate (8.5 g) dissolved in water (100 ml) was added into the above solution over two minutes. To this solution a solution containing potassium bromide (1.2 g) dissolved in water (50 ml) was added over two minutes. The prepared emulsion was adjusted in pH to form a precipitate and the excess salt was removed. The mulsion was adjusted to pH 6.0, thereby providing 200 g of the emulsion.

A method of preparing a gelatin dispersion of a dye-providing substance:

Dye-providing substance having the below formula 10 g),

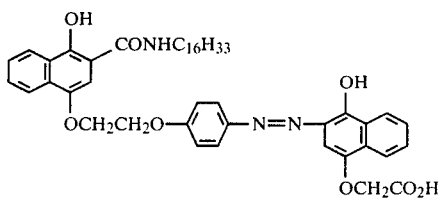

succinic acid-2-ethylhexyl ester sulfonic acid sodium salt (0.5 g) as a surface active agent, and tricresyl phosphate (TCP) (4 g) were dissolved into cyclohexanone (20 ml) at 60° C. A mixture of the resulting solution and 10% aqueous solution (100 g) of lime-processed gelatin was dispersed by means of a homogenizer at 10,000 rpm for 10 minutes.

A method of preparing a light-sensitive coating material is described below.

| | | |
|---|---|---|
| (a) | Silver benzotriazole emulsion containing light-sensitive silver bromide | 10 g |
| (b) | Dispersion of dye providing material | 3.5 g |
| (c) | Base precursor (1) | 0.24 g |
| (d) | Gelatin (10% aqueous solution) | 5 g |
| (e) | Methanol solution containing 2,6-dichloro-4-aminophenol (200 ml) | 4 ml |

(a) to (e) described above were mixed and melted. The resulting solution was coated at a wet layer thickness of 30 μm on a polyethylene terephthalate film having a thickness of 180 μm. After drying, this coating sample was imagewise exposed at 2000 lux for 10 seconds by a tungsten lamp. Then this sample was uniformly heated at 150° C. for 20 minutes on a heat block.

Using the image receiving material prepared in Example 2 the heated sample was processed in the same manner as in Example 2 to obtain a negative magenta color image on the image receiving material. A maximum density and a minimum density of this negative image were 1.88 and 0.18, respectively, measuring by means of a Macbeth reflective densitometer (RD-519).

It is understood that the compound of this present invention shows a good effect.

EXAMPLE 6

A method of preparing a gelatin dispersion of the below dye providing substance:

Dye providing substance having the below formula (5 g),

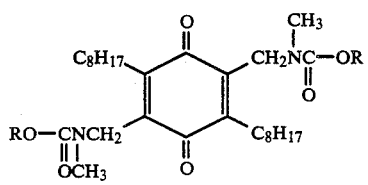

-continued

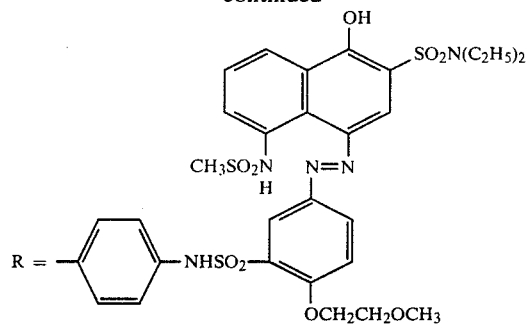

Electron donative substance (4 g),

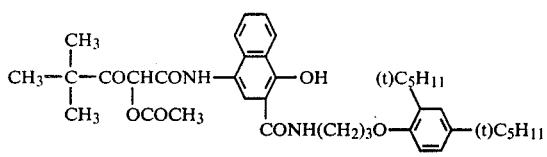

succinic acid-2-ethylhexyl ester sulfonic acid sodium salt (0.5 g) and tricresyl phosphate (TCP) (10 g) were dissolved into cyclohexanone (20 ml) at about 60° C. A mixture of the resulting solution and 10% aqueous solution (100 g) of gelatin was dispersed by means of a homogenizer at 10,000 rpm for 10 minutes.

A method of preparing a light-sensitive coating material is described below.

| | | |
|---|---|---|
| (a) | Silver benzotriazole emulsion containing light-sensitive silver bromide (described in Example 5) | 10 g |
| (b) | Dispersion of dye-providing material (prepared in this Example) | 3.5 g |
| (c) | Base precursor (1) | 0.34 g |
| (d) | 5% Aqueous solution of the below compound | 1.5 ml |

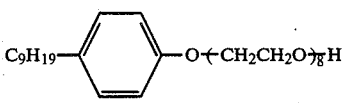

Water (4 ml) was added into the mixture of (a) to (d). After melting, this solution was coated at a wet layer thickness of 30 μm on a polyethylene terephthalate film. This coating material was dried to provide a light-sensitive material.

This light-sensitive material was imagewise exposed at 2000 lux for 10 seconds by a tungsten lamp. Then the light-sensitive material was uniformly heated at 140° C. for 40 seconds on a heat block. The image receiving material described in Example 2 was soaked in water and superimposed on the above heated light-sensitive material in such a manner that the layers were in contact with each other. A positive magenta color image was obtained on the image receiving material. The density of this positive image was measured by green light by use of a Macbeth reflective densitometer (RD-519) to obtain 1.76 as the maximum density and 0.24 as the minimum density.

It is understood tht the base precursor of the present invention is effective.

While the invention has been described in detail and with reference to specific embodiments thereof, it will be apparent to one skilled on the art that various changes and modifications can be made therein without departing from the spirit and scope thereof.

What is claimed is:

1. A heat-developable light-sensitive material comprising a support having thereon a silver halide emulsion layer and a reducing agent, wherein at least one layer contains at least one base precursor represented by the following formula (I):

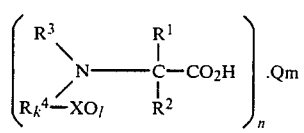

wherein X represents a carbon atom, a nitrogen atom or a sulfur atom; $R^1$ and $R^2$ a hydrogen atom, a halogen atom, an alkyl group, an alkenyl group, an alkynyl group, a cycloalkyl group, an aralkyl group, an aryl group, an alkoxy group, an aryloxy group, an alkylthio group, an arylthio group, a heterocyclic group, an acylamino group, an alkylsulfinyl group, an arylsulfinyl group, a nitro group, an acyl group, a sulfamoyl group, a substituted sulfamoyl group, a carbmoyl group, a substituted carbamoyl group, an alkoxycarbonyl group, an aryloxycarbonyl group, a —$CO_2H.Q$ group (Q represents a base described below), a

group, a

group (R represents an alkyl group or an aryl group) or a hydroxy group; $R^3$ and $R^4$ represent a hydrogen atom, an alkyl group, an alkenyl group, an alkynyl group, a cycloalkyl group, an aralkyl group, an aryl group, an alkoxy group, an aryloxy group, an alkylthio group, an arylthio group, a heterocyclic group or an acyl group; the alkyl group and the aryl group may have a substitutent; at least two of $R^1$, $R^2$, $R^3$ and $R^4$ may combine with each other to make a ring; k represents 0 or 1; l represents an integer of 1 or 2; between k and l there is a numerical relation such that the valencies of X, $R^4$ and an oxygen atom balance each other; Q is a base; n and m represent an integer of 1 or 2 and between n and m there is a numerical relation such that the value of a plus valency and a minus valency are equal in the base precursor.

2. A heat-developable light-sensitive material as in claim 1, wherein X represents a nitrogen atom or a sulfur atom.

3. A heat-developable light-sensitive material as in claim 1, wherein B represents a base having a pKa value of 7 or more and a boiling point of 100° C. or higher.

4. A heat-developable light-sensitive material as in claim 1, wherein B represents a quanidine compound, a cycloguanidine compound, an amidine compound or a cycloamidine compound.

5. A heat-developable light-sensitive material as claimed in claim 1, wherein X represents a carbon atom.

6. A heat-developable light sensitive material as claimed in claim 1, wherein X represents a nitrogen atom.

7. A heat-developable light-sensitive material as in claim 1, wherein the silver halide is spectrally sensitized.

* * * * *